United States Patent [19]

Nakatsuka et al.

[11] Patent Number: 5,396,511
[45] Date of Patent: Mar. 7, 1995

[54] SEMICONDUCTOR LASER APPARATUS WITH CURVED WAVEGUIDE

[75] Inventors: Shin'ichi Nakatsuka, Hino; Kenji Uchida; Shinichirou Yano, both of Hachioji, all of Japan

[73] Assignee: Hitachi, Ltd., Tokyo, Japan

[21] Appl. No.: 970,208

[22] Filed: Nov. 2, 1992

[30] Foreign Application Priority Data

Nov. 7, 1991 [JP] Japan .................................. 3-291627

[51] Int. Cl.⁶ .............................................. H01S 3/18
[52] U.S. Cl. ...................................... 372/43; 372/92; 385/131
[58] Field of Search ............... 385/14, 129, 130, 131, 385/132; 372/43–50, 92, 93

[56] References Cited

U.S. PATENT DOCUMENTS

| | | | |
|---|---|---|---|
| 3,743,962 | 7/1973 | Rosenberg | 385/130 X |
| 4,592,061 | 5/1986 | Kumabe et al. | 372/45 |
| 4,901,123 | 2/1990 | Noguchi et al. | 385/14 X |
| 5,052,015 | 9/1991 | Ackerman et al. | 372/45 X |

OTHER PUBLICATIONS

Appl. Phys. Lett. 57 (10), 3 Sep. 1990, Nadav Bar-Chaim et al.: *Half-ring geometry quantum well GaAlAs lasers*, American Institute of Physics, pp. 966–967.

*Primary Examiner*—John D. Lee
*Attorney, Agent, or Firm*—Kenyon & Kenyon

[57] ABSTRACT

A semiconductor laser apparatus having an optical waveguide made of a semiconductor crystal, an optical cavity made of a mirror facet for reflecting light into the optical waveguide, and an optical gain region occupying at least part of the optical waveguide for generating an optical gain when powered. The optical gain region exists over a linear portion of the optical waveguide. The remaining portion of the optical waveguide is at least partially bent in structure.

20 Claims, 3 Drawing Sheets

SEMICONDUCTOR LASER APPARATUS WITH CURVED WAVEGUIDE

BACKGROUND OF THE INVENTION

The present invention relates to a semiconductor laser apparatus for use as a light source for optical storage and optical communication applications.

As described in Appl. Phys. Lett., 57(10)966 (1990) by N. Bar-Chaim et al., the more recent prior art bent waveguide semiconductor laser apparatus forms a semiconductor laser cavity with the mirror surface of the same cleaved facet by suitably bending an optical waveguide having an optical gain conducive to constituting a semiconductor laser. Semiconductor laser apparatuses of this type appear to be effective when used by optical integrated devices because, unlike other traditional semiconductor laser apparatuses, the former are not limited in device size by cleavage requirements.

The above-mentioned more recent type of prior art semiconductor laser apparatus has its share of disadvantages. One disadvantage is that because the bent portion of the waveguide doubles as an optical gain region, it is difficult to meet simultaneously both the optimum design conditions for the optical gain region as part of the optical waveguide and the conditions for minimizing the bending loss of the optical waveguide. To obtain a high-output fundamental mode from the semiconductor laser apparatus requires that the optical waveguide be as wide as possible and that the difference in effective refractive index between the inside and outside of the optical waveguide be approximately between $1 \times 10^{-3}$ and $5 \times 10^{-3}$. Meanwhile, the effective refractive index difference of at least $1 \times 10^{-2}$ is known to be needed to minimize the cavity loss of the bent portion. Another disadvantage of the prior art semiconductor laser apparatus is that changes in the direction of the optical waveguide in the optical gain region necessarily entail varied etching shapes and crystal growth shapes of the semiconductor crystal employed.

SUMMARY OF THE INVENTION

The present invention provide a semiconductor laser apparatus comprising an optical waveguide having an appropriate optical gain region, with the remaining portion of the optical waveguide suffering from a minimum bending loss.

In carrying out the present invention and according to one aspect thereof, there is provided a semiconductor laser apparatus made of a semiconductor laser device mounted on a substrate, comprising, an optical waveguide made of a semiconductor crystal for confining light; an optical cavity made of a said optical waveguide and mirror facet for reflecting light into the optical waveguide; and an optical gain region occupying at least part of the optical waveguide for generating an optical gain when powered; wherein the optical gain region exists over a linear portion of the optical waveguide, the remaining portion of said optical waveguide being at least partially bent in structure.

In a preferred structure according to the present invention, the pair of mirror facets is formed on the same cleaved facet. In another preferred structure, a plurality of semiconductor laser devices are furnished on the same substrate, and the distance between the optical waveguides constituting the optical gain regions of the plurality of semiconductor laser devices is greater than the distance between the beam emitting positions of the respective semiconductor laser devices. In a further preferred structure, that portion of the optical waveguide which is different from the portion constituting the optical gain region is branched and connected to a beam outlet optical waveguide, the tip of the beam outlet optical waveguide emitting a laser beam.

Where the light output power and energy conversion efficiency of the semiconductor laser are concerned, the optical waveguide containing the optical gain region in the semiconductor laser device should be as wide as possible in structure. The wider the optical waveguide, the lower the amount of current inflow per unit area. This makes it possible to acquire high levels of light output power without overloading the semiconductor crystal. To prevent a widened optical waveguide of the semiconductor laser device from developing higher lateral mode generation requires securing an optimum difference in effective refractive index between the inside and the outside of the optical waveguide. On the one hand, if the difference in effective refractive index is $5 \times 10^{-3}$ or less, there occurs a high intensity level of light that penetrates and goes out of the optical waveguide in higher lateral mode. The resulting large loss in higher lateral mode stops oscillation. On the other hand, if the difference in effective refractive index is higher than $5 \times 10^{-3}$, a low intensity level of light that penetrates and goes out of the optical waveguide, even in higher lateral mode, readily permits oscillation.

Meanwhile, where the optical waveguide of the semiconductor laser is partially bent, the bending loss should preferably be minimized by maximizing the difference in effective refractive index between the inside and the outside of the optical waveguide. For example, to reduce the bending loss of an optical waveguide having a radius of curvature of 50 µm to 80% or less requires a difference in effective refractive index of at least $1 \times 10^{-2}$.

So far, it has been impossible to ensure concurrently reductions of the bending loss, high reliability of the optical gain region at the time of high light output power, and stabilization of fundamental mode. The present proposes a semiconductor laser apparatus having a waveguide structure in which the optical gain region is separated from the bending region. The optical gain region requiring a relatively small difference in refractive index is formed in a linear portion of the waveguide, while the bent region requiring a large difference in refractive index is constructed to be transparent to a laser beam. In this manner, the requirements of both the optical gain region and the bent region are met at the same time.

In an application of the above-proposed structure, the gain regions are separated from one another by a distance at least long enough to prevent thermal interference therebetween. The beam emitting positions are readily provided in narrow areas by array devices or optical integrated devices. The array devices are furnished close to one another through the bent waveguides, and the optical integrated devices have their edges formed on the same cleaved facet constituting each device.

In the semiconductor laser of the above-described type, the laser beam is emitted to the outside by branching the optical waveguides or by transfer of optical energy between the optical waveguides. This is made possible because the optical waveguides having a large difference in effective refractive index between the inside and the outside thereof suffer only small losses upon waveguide branching or upon optical energy transfer between the waveguides. Where the laser beam is acquired by use of energy transfer between the optical waveguides, the receiving waveguide is to be located on the outer circumference side of the bent portion. This structure, by promoting optical energy transfer from the inner to the outer circumference, acts as an isolator that prevents the emitted laser beam from returning to the cavity. That is, the isolator inhibits noise generation.

These and other objects, features and advantages of the invention will become more apparent upon a reading of the following description and appended drawings.

DETAILED DESCRIPTION

First Embodiment

The first preferred embodiment of the present invention will now be described with reference to FIGS. 1A, 1B and 1C. Initially, on a substrate 1 made of n-GaAs (Si doped; $n=2\times10^{18}cm^{-3}$), the MOCVD (metal organic chemical vapor deposition) method is used to form five layers successively: a cladding layer 2 made of n-$Al_{0.5}Ga_{0.5}As$ (Se doped; $n=2\times10^{18}cm^{-3}$; 1.5 μm in thickness), an optical waveguide layer 3 made of n-$Al_{0.3}Ga_{0.7}As$ (Se doped; $n=2\times10^{18}cm^{-3}$; 0.1 μm in thickness), an active layer 4 made of $Al_{0.1}Ga_{0.9}As$ (undoped; 60 nm in thickness), a cladding layer 5 made of p-$Al_{0.5}Ga_{0.5}As$ (Zn doped; $p=1\times10^{18}cm^{-3}$; 0.5 μm in thickness), and a blocking layer 6 made of n-GaAs (Se doped; $n=2\times10^{18}cm^{-3}$; 0.8 μm in thickness). Then conventional photolithography is utilized to form a rectangular photo resist mask measuring about 400 μm by 200 μm to protect an optical gain region 7. From the region other than the optical gain region 7, the semiconductor layers down to the active layer 4 are removed by chemical etching. The etching process is controlled with ease and with precision by the combined use of two kinds of etching solution: phosphoric acid type etching solution for indiscriminate removal of AlGaAs and GaAs, and HF type etching solution for selectively etching AlAs layers of at least 0.4 in crystallinity.

Figure 1A:
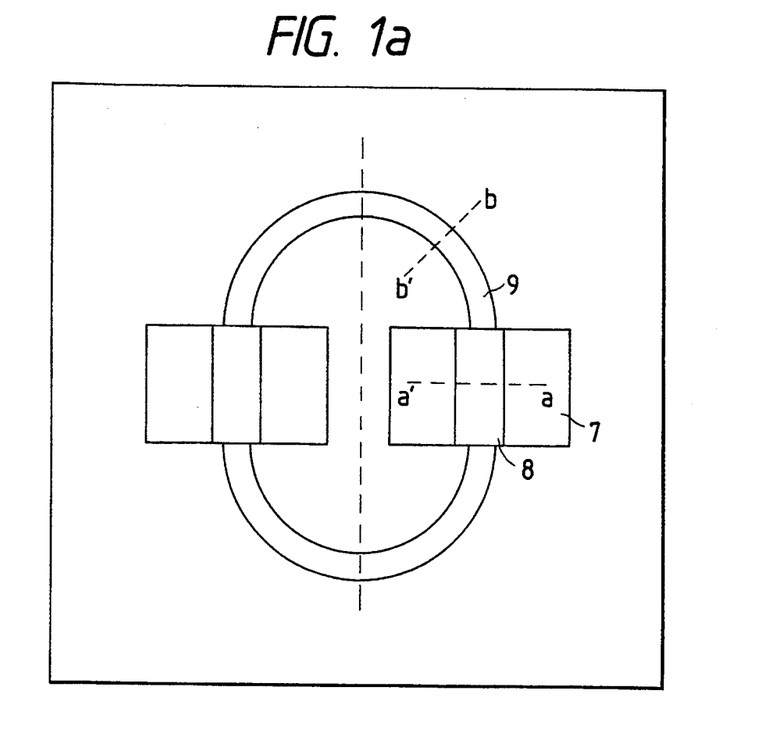
FIG. 1A is a plan view of a semiconductor laser apparatus practiced as a first embodiment of the present invention.

Next, photolithography is again employed to form an $SiO_2$ mask of FIG. 1A wherein a slit type pattern 8 having a width of 5 μm is formed in the optical gain region 7 and a stripe type pattern 9 having a width of about 2 μm is so formed in the remaining region as to connect two optical gain regions 7 in arc fashion. The stripe type and slit type patterns 9 and 8 are connected at the boundaries of the optical gain regions 7. The phosphoric acid type etching solution is first applied onto the $SiO_2$ mask for about 0.2 μm of etching, followed by the selective etching of GaAs by an ammonia type etching solution. This causes the blocking layer 6 in the optical gain region 7 to develop a groove formation that reaches down to the cladding layer 5. In the region other than the optical gain region 7, a ridge formation 0.2 μm high containing the optical waveguide layer 3 appears flanked on both sides by grooves.

The MOCVD method is used again to form three more layers by crystal growth: a p-$Al_{0.5}Ga_{0.5}As$ layer 10 (Zn doped; $p=2\times10^{18}cm^{-3}$; 0.3 μm thick); an n-$Al_{0.5}Ga_{0.5}As$ layer 11 ( Zn doped; $n=2\times10^{18}cm^{-3}$; 1.2 μm thick ), and an n-GaAs layer 12 (Zn doped; $p=2\times10^{18}cm^{-3}$; 1 μm thick). In the optical gain region 7, Zn diffusion is performed until the cladding layer 5 is reached. Both sides of the semiconductor crystal thus formed are then furnished with electrodes. The crystal is then cleaved across the broken line of FIG. 1A to produce laser chips.

Figure 1B:
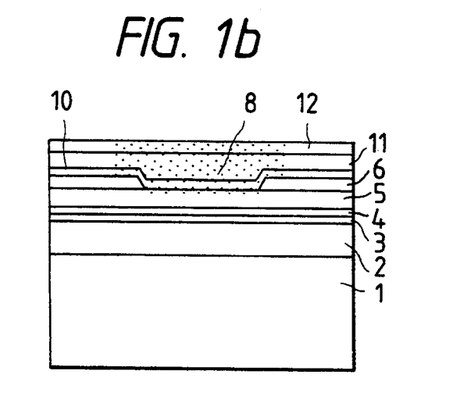
Fig. 1B is a cross-sectional view of a gain region in the first embodiment of FIG. 1A.
Figure 1C:
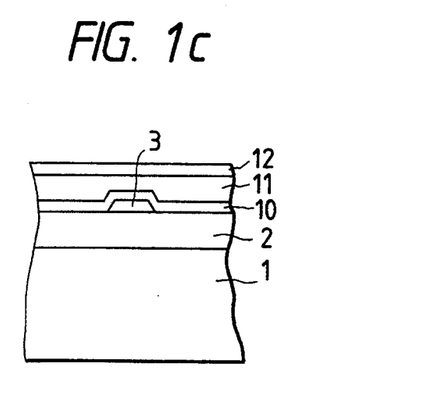
FIG. 1C is a cross-sectional view of a bent region of the first embodiment.

Each finished laser chip has its edge (i.e., across line a-a' in FIG. 1A) sectionally structured as shown in Fig. 1B and has its center portion (across line b-b' in FIG. 1A) sectionally constructed as depicted in FIG. 1C. The difference in effective refractive index between the inside and outside of the optical waveguide in the optical gain region is approximately between $1\times10^{-3}$ and $5\times10^{-3}$, whereas the difference in effective refractive index between the inside and outside of the optical waveguide at the bent portion is about $1\times10^{-2}$. The semiconductor laser apparatus practiced as the first embodiment above provides continuous oscillation at room temperature on a threshold current of about 20 mA. Tests have shown that the embodiment remains stably in lateral fundamental mode until a light output power level of 300 mW is reached.

Second Embodiment

Figure 2A:
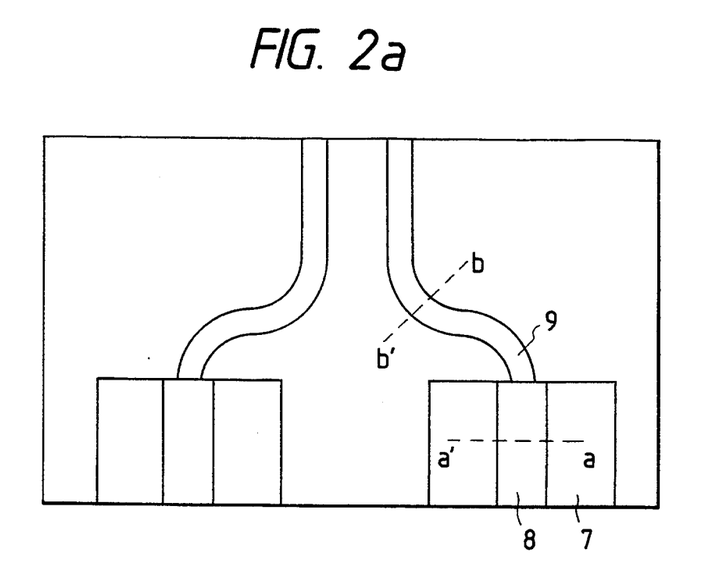
FIG. 2A is a plan view of optical waveguides in a semiconductor laser apparatus practiced as a second embodiment of the present invention.

The second preferred embodiment of the present invention comprises a plurality of semiconductor laser devices whose beam emitting positions alone are made close to one another by bent optical waveguides. This is an array laser apparatus with no thermal cross talk. Initially, on a substrate 1 made of n-GaAs (Si doped; $n=2\times10^{18}cm^{-3}$), the MOCVD method is used to form five layers successively: a cladding layer 2 made of n-$Al_{0.5}Ga_{0.5}As$ (Se doped; $n=2\times10^{18}cm^{-3}$; 1.5 μm in thickness), an optical waveguide layer 3 made of n-$Al_{0.3}Ga_{0.7}As$ (Se doped; $n=2\times10^{18}cm^{-3}$; 0.1 μm in thickness), a multi-quantum-well active layer 13 (undoped; 3 GaAs well layers and 2 $Al_{0.3}Ga_{0.7}As$ barrier layers), a cladding layer 5 made of p-$Al_{0.5}Ga_{0.5}As$ (Zn doped; $p=1\times10^{18}cm^{-3}$; 0.5 μm in thickness), and a blocking layer 6 made of n-GaAs (Se doped; $n=2\times10^{18}cm^{-3}$; 0.8 μm in thickness). Then conventional photolithography is utilized to form a rectangular $SiO_2$ photo resist mask measuring about 400 μm by 200 μm to protect an optical gain region 7. From the region other than the optical gain region 7, the semiconductor layers down to a halfway depth of the cladding layer 5 are removed by chemical etching. The etching process is carried out using a phosphoric acid type etching solution for indiscriminate removal of AlGaAs and GaAs. In the optical gain region 7, Ga ion implantation is performed to a depth of about 0.7 μm to disorder the multi-quantum-well active layer 13.

Next, photolithography is again utilized to form an $SiO_2$ mask of FIG. 2A wherein a slit type pattern 8 is formed in the optical gain region 7 and a stripe type pattern 9 having a width of about 2 μm is formed in an S-shape in the remaining region. The stripe type and slit type patterns 9 and 8 are connected at the boundaries of the optical gain regions 7. The phosphoric acid type etching solution is first applied onto the $SiO_2$ mask for about 0.7 μm of etching, followed by the selective etching of GaAs by an ammonia type etching solution. This causes the blocking layer 6 in the optical gain region 7 to develop a groove formation that reaches down to the cladding layer 5. In the region other than the optical gain region 7, a ridge formation 0.7 μm high containing the optical waveguide layer 3 acting as the optical waveguide appears flanked on both sides by grooves.

Figure 2B:
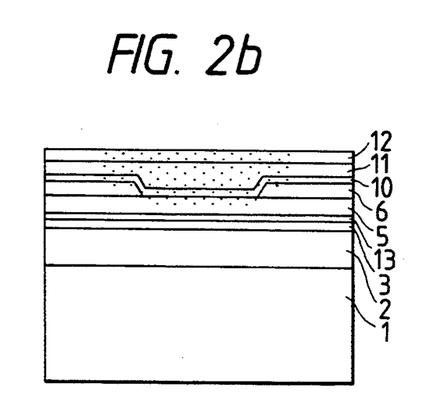
FIG. 2B is a cross-sectional view of a gain region in the second embodiment of FIG. 2A.
Figure 2C:
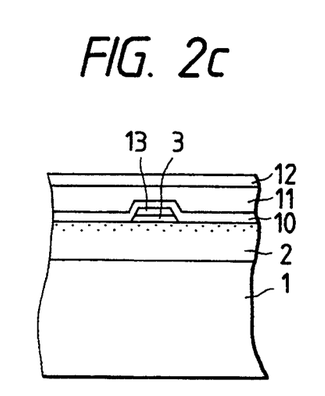
FIG. 2C is a cross-sectional view of a bent region in the second embodiment.

The MOCVD method is used again to form three more layers by crystal growth: a p-$Al_{0.5}Ga_{0.5}As$ layer 10 (Zn doped; $p=2\times10^{18}cm^{-3}$; 0.3 μm thick); an n-$Al_{0.5}Ga_{0.5}As$ layer 11 (Zn doped; $n=2\times10^{18}cm^{-3}$; 1.2 μm thick), and an n-GaAs layer 12 (Zn doped; $p=2\times10^{18}cm^{-3}$; 1 μm thick). In the optical gain region 7, Zn diffusion is performed until the cladding layer 5 is reached. The finished laser chip has its edge (i.e., across line a-a′ in FIG. 2A) sectionally structured as shown in FIG. 2B and has its center portion (across line b-b′ in FIG. 2A) sectionally constructed as depicted in FIG. 2C.

Both sides of the semiconductor crystal thus formed are then furnished with electrodes. The crystal is then cleaved across the upper edge of FIG. 1A to produce the laser chip. The distance between two optical gain regions is at least 200 μm, with little cross talk occurring therebetween. A bent transparent optical waveguide arrangement locates the beam emitting positions 10 μm apart. This allows the laser beams from both laser devices to focus easily onto a plane through a single lens system. This feature permits the invention to be applied with ease to various uses including optical recording apparatuses.

Third Embodiment

Figure 3:
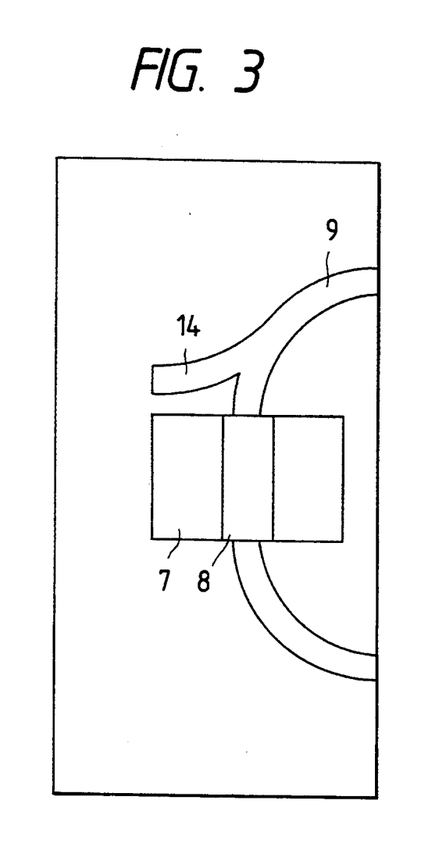
FIG. 3 is a plan view of a branched optical waveguide of a semiconductor laser apparatus practiced as a third embodiment of the present invention.
Figure 4:
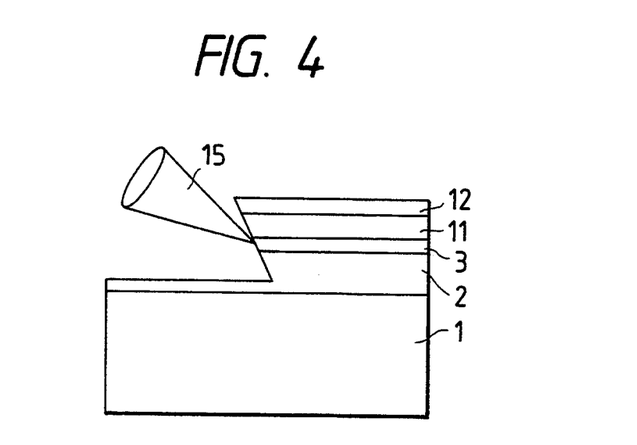
FIG. 4 is a partial cross-sectional view of the branched optical waveguide in the third embodiment of FIG. 3.

The third preferred embodiment of the present invention is a semiconductor laser apparatus that involves not letting a laser beam be emitted from the edge of one optical waveguide but branching the optical waveguide in order to acquire light output power, as illustrated in FIG. 3. The manufacturing process of the third embodiment is the same as that of the first embodiment. Part of the arc-shaped ridge optical waveguide is branched at an angle of about 20 degrees to form a beam outlet waveguide 14. The cleaved facet (right-hand edge of FIG. 3) is covered entirely with a total reflection coating having a reflection factor of 99%. This causes the laser beam to be emitted from the beam outlet waveguide 14 alone. The tip of the beam outlet waveguide 14 is treated by chemical etching to have an angle of about 75 degrees with respect to the crystal surface. The angled waveguide tip allows an output beam 15 to be emitted at an angle of at least 45 degrees relative to the substrate surface. This feature is advantageous in terms of beam emission when the invention is applied to optical integrated devices.

The tip of the beam outlet waveguide 14 may be treated to have an angle of 80 to 50 degrees with respect to the crystal surface. In that case, the angle at which to emit the laser beam may be set to about 30 through 80 degrees relative to the substrate surface.

Fourth Embodiment

Figure 5:
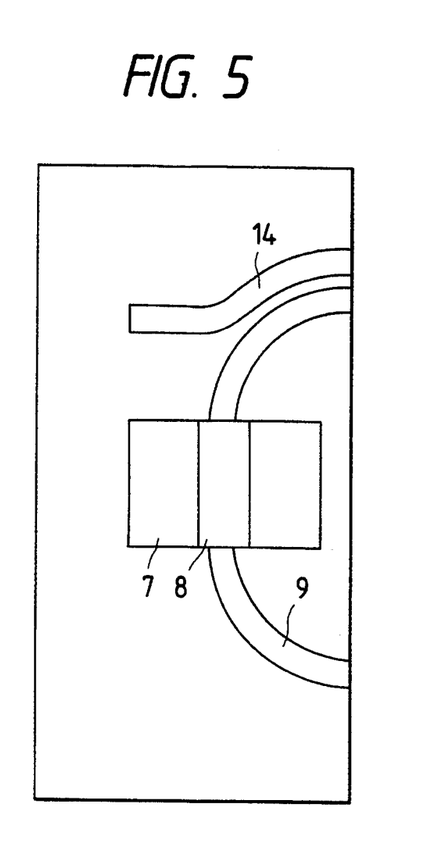
FIG. 5 is a plan view of an optical waveguide of a semiconductor laser apparatus practiced as a fourth embodiment of the present invention.

The fourth preferred embodiment of the present invention is a semiconductor laser apparatus comprising a beam outlet waveguide 14 in the form of an additional optical waveguide located about 2 μm away from the outer circumference of a bent ridge type optical waveguide, as shown in FIG. 5. The manufacturing process of the fourth embodiment is the same as that of the first embodiment. In the fourth embodiment, light transfer readily occurs from the optical waveguide that provides laser oscillation on the one hand, to the beam outlet waveguide 14 on the other. However, although feedback light reaches the laser device, no light is returned from the beam outlet waveguide 14 to the optical waveguide that performs laser oscillation. This is because light transfer is easy from the inner to the outer optical waveguide but is difficult in the reverse direction. In this manner, a semiconductor laser apparatus with no feedback noise is implemented.

In the fourth embodiment, as in the case of the third embodiment, the tip of the beam outlet waveguide 14 may be treated to have a certain angle with respect to the crystal surface. In that case, the laser beam is emitted at a certain angle relative to the substrate surface.

As described, the semiconductor laser apparatus according to the present invention contains a bent optical waveguide arrangement within its cavity to provide stable, high-power performance. Applying the technology of this invention makes it possible to produce high power output semiconductor laser apparatuses having their mirror surface made on the same cleaved facet—a feature conducive to higher integration of semiconductor laser devices. Application of the invented technology also implements semiconductor laser arrays with no thermal cross talk and with their beam emitting positions arranged significantly close to one another.

As many apparently different embodiments of this invention may be made without departing from the spirit and scope thereof, it is to be understood that the invention is not limited to the specific embodiments thereof except as defined in the appended claims.

What is claimed is:

1. A semiconductor laser apparatus made of a semiconductor laser device mounted on a substrate, comprising:

an optical waveguide made of a semiconductor crystal for confining light;

an optical cavity made of said optical waveguide and a pair of mirror facets for reflecting light into said optical waveguide; and an optical gain region occupying at least part of said optical waveguide for generating an optical gain when powered;

wherein said optical gain region exists only over a linear portion of said optical waveguide, the remaining portion of said optical waveguide being at least partially bent in structure.

2. A semiconductor laser apparatus according to claim 1, wherein a plurality of units of said semiconductor laser device are furnished on the same substrate, and wherein the distance between the optical waveguides constituting the optical gain regions of said plurality of semiconductor laser devices is greater than the distance between the beam emitting positions of the respective semiconductor laser devices.

3. A semiconductor laser apparatus according to claim 1, wherein that portion of said optical waveguide which constitutes said optical gain region is made of a material such that the difference in effective refractive index between said material and another material outside thereof will fall between $1 \times 10^{-3}$ and $5 \times 10^{-3}$.

4. A semiconductor laser apparatus according to claim 1, wherein that portion of said optical waveguide which differs from said optical gain region is made of a material such that the difference in effective refractive index between said material and another material outside thereof will be at least $1 \times 10^{-2}$.

5. A semiconductor laser apparatus according to claim 1, wherein a structure of the optical waveguide at the optical gain region mad a structure of the optical waveguide at the remaining partially bent portion are different.

6. A semiconductor laser apparatus made of a semiconductor laser device mounted on a substrate, comprising:
   an optical waveguide made of a semiconductor crystal for confining light;
   an optical cavity made of said optical waveguide and a pair of mirror facets for reflecting light into said optical waveguide; and
   an optical gain region occupying at least part of said optical waveguide for generating an optical gain when powered;
   wherein said optical gain region exists over a linear portion of said optical waveguide, the remaining portion of said optical waveguide being at least partially bent in structure; and
   wherein said pair of mirror facets is formed on a same cleaved facet.

7. A semiconductor laser apparatus made of a semiconductor laser device mounted on a substrate, comprising:
   an optical waveguide made of a semiconductor crystal for confining light;
   an optical cavity made of said optical waveguide and a pair of mirror facets for reflecting light into said optical waveguide; and
   an optical gain region occupying at least part of said optical waveguide for generating an optical gain when powered;
   wherein said optical gain region exists over a linear portion of said optical waveguide, the remaining portion of said optical waveguide being at least partially bent in structure; and
   wherein that portion of said optical waveguide which is different from the portion constituting said optical gain region is branched and connected to a beam outlet optical waveguide, a tip of the beam outlet optical waveguide being arranged to emit a laser beam.

8. A semiconductor laser apparatus according to claim 7, wherein a beam emitting tip of said beam outlet optical waveguide is positioned at a desired angle relative to a surface of said substrate so that said laser beam will be emitted at more than 0 degrees relative to said surface.

9. A semiconductor laser apparatus made of a semiconductor laser device mounted on a substrate, comprising:
   an optical waveguide made of a semiconductor crystal for confining light;
   an optical cavity made of said optical waveguide and a pair of mirror facets for reflecting light into said optical waveguide; and
   an optical gain region occupying at least part of said optical waveguide for generating an optical gain when powered;

10. A semiconductor laser apparatus according to claim 9, wherein a beam emitting tip of said beam outlet optical waveguide is positioned at a desired angle relative to a surface of said substrate so that said laser beam will be emitted at an angle more than 0 degrees relative to said surface.

11. A semiconductor laser apparatus made of a semiconductor laser device mounted on a substrate, comprising:
   an optical waveguide made of a semiconductor crystal for confining light;
   an optical cavity made of said optical waveguide and a pair of mirror facets for reflecting light into said optical waveguide; and
   an optical gain region occupying at least part of said optical waveguide for generating an optical gain when powered;
   wherein said optical gain region exists over a linear portion of said optical waveguide, the remaining portion of said optical waveguide being at least partially bent in structure, a bent region of said optical waveguide being made of a material such that a difference in refractive index between said material and another material outside the bent region is larger than a difference in refractive index between a material inside of the optical gain region and another material outside the optical gain region.

12. A semiconductor laser apparatus according to claim 11, wherein said pair of mirror facets is formed on a same cleaved facet.

13. A semiconductor laser apparatus according to claim 11, wherein a plurality of units of said semiconductor laser device are furnished on the same substrate, and wherein a distance between the optical waveguides constituting the optical gain regions of said plurality of semiconductor laser devices is greater than a distance between beam emitting positions of the respective semiconductor laser devices.

14. A semiconductor laser apparatus according to claim 11, wherein that portion of said optical waveguide which is different from the portion constituting said optical gain region is branched and connected to a beam outlet optical waveguide, a tip of the beam outlet optical waveguide being arranged to emit a laser beam.

15. A semiconductor laser apparatus according to claim 14, wherein a beam emitting tip of said beam outlet optical waveguide is positioned at a desired angle relative to a surface of said substrate so that said laser beam will be emitted at more than 0 degrees relative to said surface.

16. A semiconductor laser apparatus according to claim 11, wherein at least part of the circumference of the bent region of said optical waveguide which is different from said optical gain region has a beam outlet optical waveguide through which a laser beam may be emitted.

17. A semiconductor laser apparatus according to claim 16, wherein a beam emitting tip of said beam outlet optical waveguide is positioned at a desired angle relative to a surface of said substrate so that said laser beam will be emitted at an angle more than 0 degrees relative to said surface.

18. A semiconductor laser apparatus according to claim 11, wherein that portion of said optical waveguide which constitutes said optical gain region is made of a material such that the difference in effective refractive index between said material and another material outside the optical gain region is in a range between $1 \times 10^{-3}$ and $5 \times 10^{-3}$.

19. A semiconductor laser apparatus according to claim 11, wherein that portion of said optical waveguide which differs from said optical gain region is made of a material such that the difference in effective refractive index between said material and another material outside the optical gain region is at least $1 \times 10^{-2}$.

20. A semiconductor laser apparatus according to claim 11, wherein a structure of the optical waveguide at the optical gain region and a structure of the optical waveguide at the bent region are different.

* * * * *

UNITED STATES PATENT AND TRADEMARK OFFICE
CERTIFICATE OF CORRECTION

PATENT NO. : 5,396,511

DATED : 7 March 1995

INVENTOR(S) : Shin'ichi NAKATSUKA et al

It is certified that error appears in the above-identified patent and that said Letters Patent is hereby corrected as shown below:

| Column | Line | |
|---|---|---|
| 1 | 43 | Change "provide" to --provides--. |
| 1 | 53 | Change "of a said" to --of said--. |
| 1 | 54 | Change "and mirror facet" to --and a pair of mirror facets--. |
| 4 | 23 | Change "$=2 \times 10^{18} cm-3;$" to -- $=2 \times 10^{18} cm^{-3};$ --. |
| 7 | 21 | Change "mad" to --and--. |

UNITED STATES PATENT AND TRADEMARK OFFICE
CERTIFICATE OF CORRECTION

PATENT NO. : 5,396,511
DATED : 7 March 1995
INVENTOR(S) : Shin'ichi NAKATSUKA et al It is certified that error appears in the above-identified patent and that said Letters Patent is hereby corrected as shown below:

Column 8, after line 11 insert the following:

--wherein said optical gain region exists over a linear portion of said optical waveguide, the remaining portion of said optical waveguide being at least partially bent in structure; and wherein at least part of the circumference of that bent structure of said optical waveguide which is different from said optical gain region has a beam outlet optical waveguide through which to emit a laser beam.--

Signed and Sealed this

Twentieth Day of June, 1995

BRUCE LEHMAN

Attest:

Attesting Officer

Commissioner of Patents and Trademarks